United States Patent
Ja

(10) Patent No.: US 7,519,928 B2
(45) Date of Patent: Apr. 14, 2009

(54) METHOD FOR PROPAGATING PHASE CONSTANTS IN STATIC MODEL ANALYSIS OF CIRCUITS

(75) Inventor: Yee Ja, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 11/421,578

(22) Filed: Jun. 1, 2006

(65) Prior Publication Data

US 2007/0283304 A1    Dec. 6, 2007

(51) Int. Cl.
G06F 9/45 (2006.01)
G06F 17/50 (2006.01)

(52) U.S. Cl. .......................................................... 716/5
(58) Field of Classification Search ................... 716/5–6
See application file for complete search history.

(56) References Cited

U.S. PATENT DOCUMENTS 7,206,958 B1 *  4/2007  Sutherland et al. .......... 713/500
2007/0089076 A1 *  4/2007  Amatangelo ................... 716/6

* cited by examiner

*Primary Examiner*—Jack Chiang
*Assistant Examiner*—Suresh Memula
(74) *Attorney, Agent, or Firm*—Stephen J. Walder, Jr.; Casimer K. Salys

(57) ABSTRACT

A method for propagating phase constants for static circuit model analysis is provided. The mechanisms of the illustrative embodiments make use of multiple phases of constant propagation to handle sequential elements in a circuit model. The phases are determined based on an oscillating clock input. In one exemplary embodiment, the number of phases is determined based on a least common denominator of the periodicity of the input clocks of nets in the circuit model. The static analysis is performed for each phase taking into consideration the results of a previous phase of the static analysis with regard to sequential elements of the circuit. Results may be output for verification of the circuit design.

1 Claim, 4 Drawing Sheets

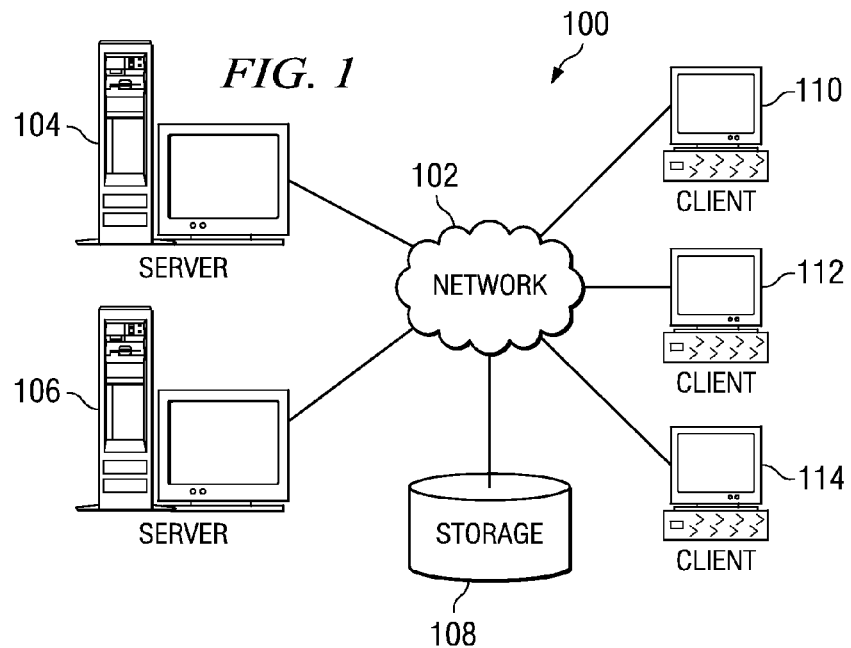
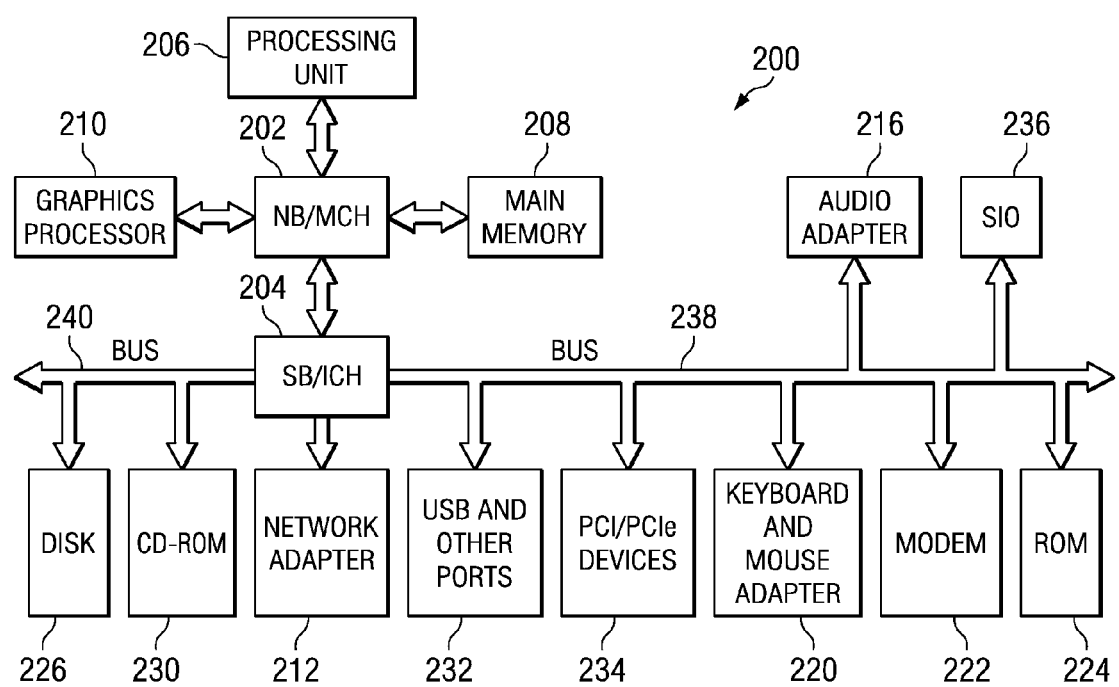

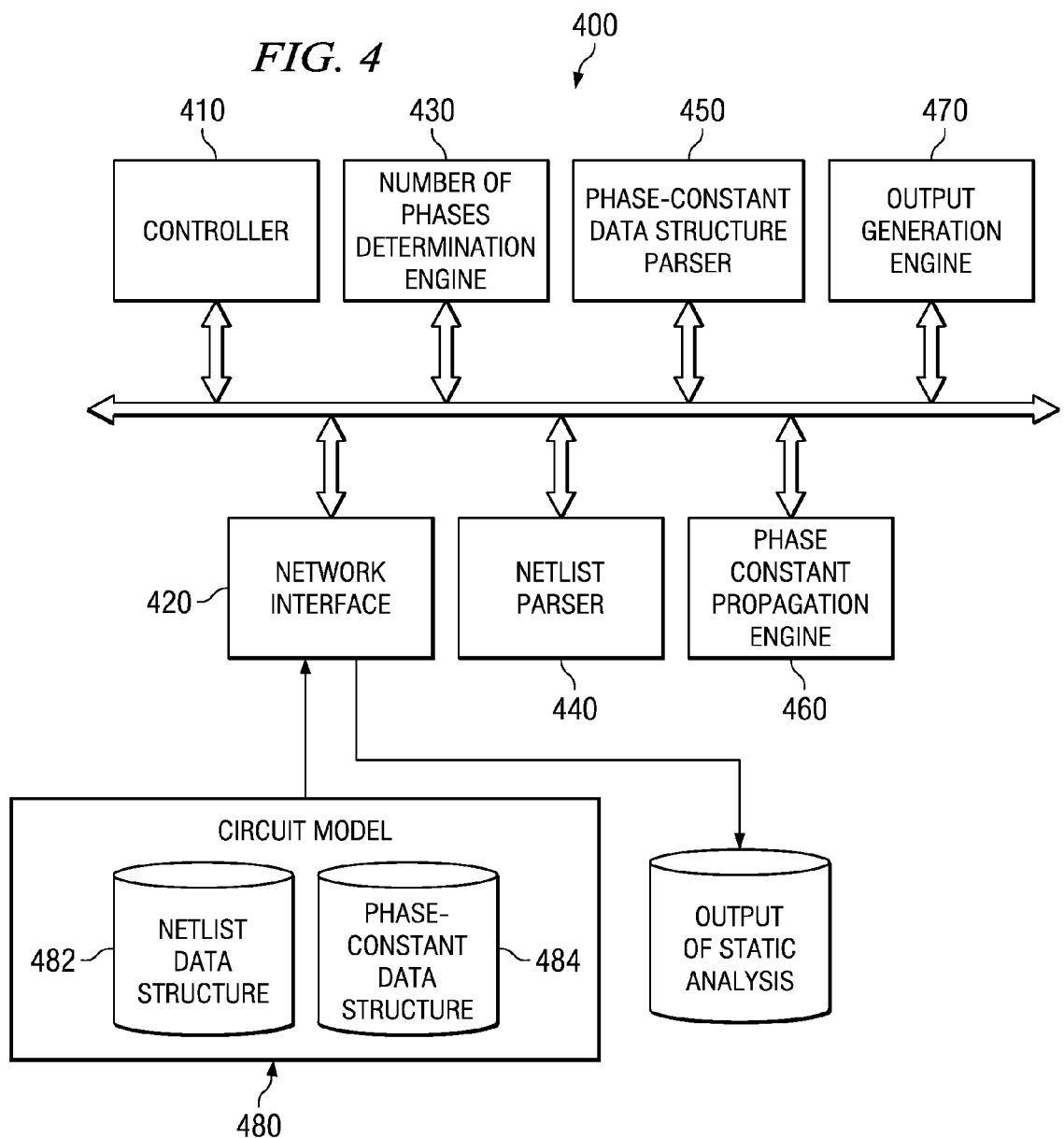

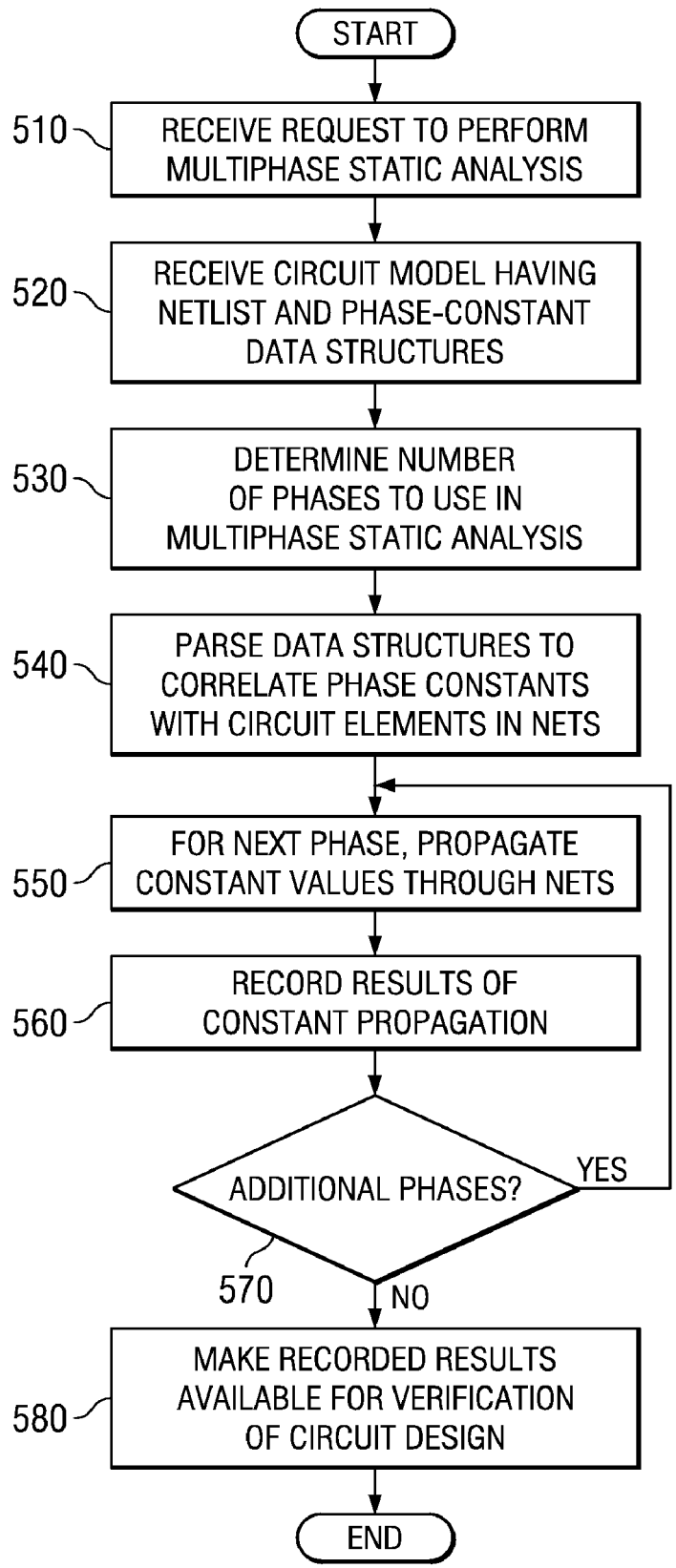

METHOD FOR PROPAGATING PHASE CONSTANTS IN STATIC MODEL ANALYSIS OF CIRCUITS

BACKGROUND

1. Technical Field

The present application relates generally to an improved circuit simulation system and method. More specifically, the present application is directed to a system and method for propagating phase constants in static model analysis of circuits.

2. Description of Related Art

Electronic design automation (EDA) is now commonly used in the design of integrated circuits. EDA makes extensive use of computers to automate the design process. Once a circuit has been designed and physically laid out, extensive testing is performed to verify that the new design and layout will work as desired. Testing of the new design is typically performed by simulating the design using a computer, which permits relatively fast verification of the circuit without necessitating physically placing the design in silicon.

Static analysis and dynamic simulation are two primary conventional methods employed to analyze and verify circuit behaviors of a design. Dynamic simulation provides a relatively close approximation of actual operation of a circuit design but requires extensive time and resources to perform. Static analysis requires less time and resources to perform, but has limitations with regard to the information that may be obtained.

One method of performing static analysis is to constrain the static analysis operation by using constants. For example, when identifying paths between points in the circuit model, constant net values can be used to prune certain paths from consideration. If the traversal leads to a data input of a multiplexer, for example, and the select value enables another data input, then it is known that traversal cannot proceed further. Constants and propagating constant values through nets of a circuit model is an important step in static model analysis.

It is fairly easy to propagate constant values through nets of a circuit model. For example, if an input of an AND gate is 0, then it is known that the output should also be 0. However, for sequential circuit models, such as static circuit models having latches or other sequential circuit elements, constant propagation usually stops at these sequential elements. It is only possible to propagate a value through a latch or other sequential element if the sequential element's "enable" input is a constant 1. For latches, this can be shown by the following expression which is typically used to represent a latch:

Latch($t$)=clock & data|($\hat{\ }$ clock) & latch ($t-1$)

A more general representation of a latch takes into account the time delays in the latch output using the following expression:

Latch($t$)=clock($t-td$) & data ($t-td$)|($\hat{\ }$ clock($t-td$)) & latch ($t-td$)

where td is a latch update delay amount. This general expression accounts for situations in which the values used to compute the latch output value during a particular phase may be from a preceding phase in the analysis. If the delay amount is less than a phase, one can "abstract away" the td value. However, the previous latch value must be from the previous phase and thus, if t is in whole units of phases, the previous latch value is latch(t−1). This results in the original latch expression above. The original simplified latch expression should not be used if the time delay for a latch update is better represented as a phase or multiple phases, or if various latch delays are employed in the model such that they are best represented with different phase delays.

From these expressions it can be seen that a problem arises due to the fact that the enable/clock input of a latch is oscillating and the latch stores/outputs values when clocked and retains old values when not clocked. Thus, in static analysis, where inputs are not clocked, and hence, there is no temporal dimension to the static analysis when propagating constant values through the circuit model, it cannot be determined what the output of a latch is since it is not possible to know what the latch's old value is. As a result, constant propagation halts at sequential elements and thus, a full understanding of the operation of the circuit cannot be obtained from static analysis.

SUMMARY

The illustrative embodiments provide a system and method for propagating phase constants for circuit model analysis. The mechanisms of the illustrative embodiments make use of multiple phases of constant propagation to handle sequential elements in a circuit model. The phases are determined based on the period of at least one oscillating or partially oscillating input signal, which may be clock, enable, or data input signals. The static analysis is performed for each phase taking into consideration the results of a previous phase of the static analysis with regard to sequential elements of the circuit. In the context of the present description, a sequential element of a circuit is an element whose output value depends upon previously held values or on a previous state of the element.

The use of multiple phases in static circuit model analysis is predicated on the observation that the data and clock inputs to a sequential element need not be constant and may be partially constant, i.e. they are constant only for one or more phases of evaluation. For a latch, which will be used as the primary example of a sequential element for purposes of discussion, the data input only needs to be constant in relation to when the enable/clock input is high. In such cases, the latch output will assume the data input value. The data input can be a non-constant value during the phases in which the enable/clock input is low, in which case, the latch output assumes the value of the previous phase.

Thus, although constant propagation usually stops at sequential elements, it need not be so in many cases. For example, if the data input of a latch is a constant value, then it can be inferred that the latch output should also have the same constant value if the clock is oscillating. The constant data value is latched-in, i.e. stored in the latch, when the clock is high and is retained when the clock is low.

In addition, oscillating clocks are also constants in regard to the fact that the clock has repeating 1 and 0 values at regular intervals. For example, a clock may have a 1 value for one time unit and then a 0 for a next time unit with this pattern repeating. The sum duration in which the clock has its 1 and 0 values is the clock period.

Based on the above it is possible to create different phases for a circuit model. Each phase may have a different set of constant values and constant propagation can be performed on each phase. In this way, the oscillating 0/1 constant value of clocks can be used with sequential elements. For clocked latches, for example, constant latch output values when the clock is low can be inferred from constant inputs when the clock is high.

When multiple oscillating input signals are involved in the circuit model, with two or more different periods, enough phases must be created to correctly represent all input signal periods. The least common denominator number of phases is one solution to ensure enough phases are utilized. The signals having smaller signal periods may repeat their earlier phases during the least common denominator number of phases.

With the illustrative embodiments, a circuit model is input to a static analyzer that implements the mechanisms of the illustrative embodiments. The circuit model may comprise a data structure that contains information regarding instances of circuit elements and connectivity information (nets) for the instances of circuit elements. Such a data structure may be provided as a netlist data structure, a hardware description language (HDL) data structure, or any other logic representation formatted data structure. For purposes of the present description, the data structure will be considered to be a netlist data structure. The circuit model may further comprise a phase-constant data structure that stores information identifying the constant values of one or more of the instances of the circuit elements in the netlist data structure for each phase of the static analysis.

The netlist and phase-constant data structures are provided to the static analyzer which performs multiphase static analysis on the circuit model using the information stored in the netlist and phase-constant data structures. That is, the static analyzer, for each phase, propagates a corresponding constant value through the nets in the netlist taking into consideration the previous constant values associated with sequential circuit elements in the nets. An output, for each phase, may be generated for each net and the output may be recorded in a results data structure, e.g., a database of phase values for signals/nets in the circuit model. The output may be provided and used, such as by a circuit verification program, by a human circuit designer, or the like, to verify the operation of the circuit design. Various insights into the operation of the circuit design may further be obtained, such as certain output signals being oscillating signals when they were not previously identified as such, and the like.

Thus, with the illustrative embodiments, a temporal dimension is added to traditional constant propagation performed in static analysis through the use of phases based on clock, enable, and/or data input signal oscillations. Previously, such a temporal dimension could only be realized through rigorous simulation of the circuit design which takes considerable more time and effort to perform. The temporal dimension of the static analysis in accordance with the illustrative embodiments permits constant propagation to flow through sequential elements during static analysis of circuit models rather than the static analysis being stopped at such elements. The finer granularity introduced by the implementation of multiple phases for constant value propagation makes it possible to assign and infer constant values which would normally require simulation to achieve.

In one illustrative embodiment, a method, in a data processing system, is provided for modeling a circuit. The method may comprise providing a phase-constant data structure identifying constant values for a plurality of phases of operation of at least one element in a net of a circuit design and performing static analysis of the net by propagating constant values through the net in multiple phases based on the phase-constant data structure. The method may further comprise outputting results of the propagation of the constant values through the net for the multiple phases. The results may be indicative of valid or invalid operation of the net.

The at least one element in the net of the circuit design may comprise at least one sequential element. A number of phases of the static analysis may be determined based on a period of at least one oscillating input signal to the net.

Moreover, the number of phases of the static analysis may be determined based on periods of a plurality of oscillating input signals to the net. In such a case, the number of phases may be a least common denominator number of phases determined based on the periods of the plurality of oscillating input signals. The plurality of oscillating input signals may include at least one clock input signal and at least one data input signal.

Static analysis of the net in a first phase of the multiple phases may be performed based on results of the static analysis of the net in a second phase of the multiple phases that is previous to the first phase. The phase constant data structure may associate constant values to oscillating signals of the net.

In a further illustrative embodiment, a system for modeling a circuit is provided. The system may comprise a processor and a memory coupled to the processor. The memory may contain instructions which, when executed by the processor, cause the processor to receive a phase-constant data structure identifying constant values for a plurality of phases of operation of at least one element in a net of a circuit design and perform static analysis of the net by propagating constant values through the net in multiple phases based on the phase-constant data structure. The instructions may further cause the processor to output results of the propagation of the constant values through the net for the multiple phases. The results may be indicative of valid or invalid operation of the net.

In yet another illustrative embodiment, a computer program product comprising a computer useable medium having a computer readable program is provided. The computer readable program, when executed on a computing device, may cause the computing device to perform selective ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is an exemplary block diagram of a distributed data processing system in which the illustrative embodiments may be implemented;

FIG. 2 is an exemplary block diagram of a computing system in which exemplary aspects of the illustrative embodiments may be implemented;

FIG. 4 is an exemplary block diagram of a multiphase static analysis mechanism in accordance with one illustrative embodiment; and FIG. 5 is a flowchart outlining an exemplary operation for performing multiphase static analysis in accordance with one illustrative embodiment.

DETAILED DESCRIPTION OF THE PREFERRED EMBODIMENTS

Figure 3A:
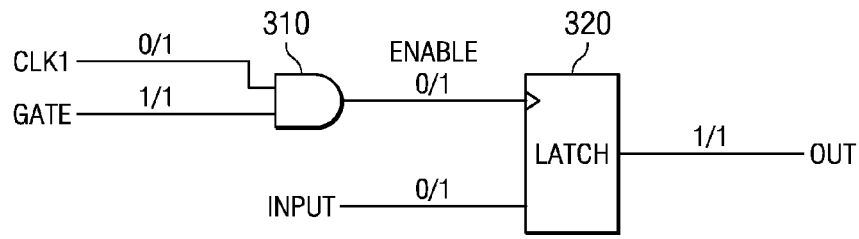
FIGS. 3A-3D are exemplary diagrams of multi-phase static analysis constant propagation, in accordance with one illustrative embodiment, with regard to a sequential circuit element whose clock (enable) input is generated by an AND logic gate.

The illustrative embodiments provide a mechanism for propagating constants through a circuit model during static analysis of the circuit model. The propagation of constants is performed with regard to pre-established phases of static analysis so that the constants may be propagated through sequential elements, such as latches. The number of phases, in one illustrative embodiment, is the least common denominator number of phases of the clock, enable, and/or data input signals involved in the static analysis so as to ensure enough phases are utilized. The multiphase static analysis of the illustrative embodiments may be carried out on an entire circuit model or on specified blocks of a circuit model. For purposes of discussion, the present description will assume that the multiphase static analysis is performed on the entire circuit model.

The illustrative embodiments may be implemented in a single data processing system or may be distributed across a plurality of data processing systems that are coupled to one another via one or more communications networks. For example, a server computing device may provide circuit model static simulation and analysis engines that may be applied to circuit models provided by other computing devices, such as client computing device. A client computing device may communicate with the server computing device via the one or more communications networks so as to control the application of static simulation and analysis engines of the illustrative embodiments to circuit models, which may be provided as netlist data structures, for example. Alternatively, the circuit models and analysis engines may be provided entirely on the same computing device such that multiple computing devices and communication networks are not necessary. For purposes of the present description, however, it will be assumed that the illustrative embodiments are implemented in a distributed data processing system.

With reference now to the figures and in particular with reference to FIGS. 1-2, exemplary diagrams of data processing environments are provided in which embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments provide a system and method for propagating phase constants for circuit model analysis. For example, with reference again to FIG. 1, the server 104 may provide a static analysis engine in accordance with the mechanisms of the illustrative embodiments. A client computing device, such as client 110, may provide a circuit model to the server 104 upon which the static analysis engine of server 104 is to operate in order to verify the design of the circuit. This circuit model may comprise, for example, a netlist data structure defining the various nets of the circuit model and a phase-constant data structure that defines the constant values associated with inputs to one or more of the nets in the netlist for each of a plurality of phases of clock and/or data signals. The phase constant data structure thus, associates constant values to oscillating signals of the net, including oscillating clock signals of one or more clock nets.

It should be appreciated that while the illustrative embodiments will be described with regard to nets in a netlist data structure, the present invention is not limited to use of a netlist data structure. Rather, other types of data structures that provide a logic description representative of a circuit design may be used without departing from the spirit and scope of the present invention. For example, a hardware description language data structure may be used to provide the necessary information, in addition to the phase-constant data structure, for performing multiphase static analysis of a circuit design.

The netlist and phase-constant data structures are input to the static analysis engine of the server 104 as the circuit model. The static analysis engine performs multiphase static analysis on the circuit model and generates an output data structure that defines the values of the outputs of the circuit elements of the nets in the circuit model during each phase of the multiphase static analysis. Thus, through the mechanisms of the illustrative embodiments, a temporal dimension is added to traditional constant propagation performed in static analyzers. This allows constants to be propagated through sequential elements, such as latches and the like.

In the illustrative embodiments, the phases of the multiphase static analysis are determined based on the period of at least one oscillating input signal, e.g., an input clock and/or data signal. Preferably, the phases are determined based on the periods of input signals, e.g., clock, enable, and/or data input signals, to sequential elements of the net. Thus, an initial traversal of the nets in the circuit model, using the information stored in the phase-constant data structure, may be performed to identify the periods of the input signals to sequential elements and to determine a number of phases to be used in the multiphase static analysis.

The use of multiple phases in the static circuit model analysis is predicated on the observations that constant propagation need not stop at sequential elements and that oscillating, or even partially oscillating, clocks, enable, and/or data input signals, may be considered repeating constants, as discussed hereafter. The use of multiple phases allows sequential elements of a circuit design to be modeled using static analysis taking into consideration the temporal operation of these sequential elements without having to perform a full simulation of the circuit model.

In known static analyzers, constant propagation usually stops at sequential elements, since it is not possible to know whether the value of the sequential element is an old or current data value. This is because typical static analysis does not take into consideration the temporal dimension of the operation of a sequential element. However, the illustrative embodiments recognize that it need not be necessary in many cases to stop static analysis at sequential elements so long as the temporal operation of the sequential elements may be accurately modeled in the static analysis.

For example, if the data input of a latch is a constant value, then it can be inferred that the latch output should also have the same constant value, whether or not the clock is oscillating. The constant data value is latched-in, i.e. stored in the latch, when the clock is high and is retained when the clock is low.

In addition, oscillating clocks may also be treated as constants within individual phases since the clock has repeating 1 and 0 values at regular intervals. For example, a clock may have a 1 value for one time unit and then a 0 for a next time unit with this pattern repeating. Within the first time unit, the clock has a constant 1 value and within the second time unit, the clock has a constant 0 value. The sum duration in which the clock has its 1 and 0 values is the clock period.

Based on the above it is possible to create different phases for a circuit model. Each phase may have a different set of constant values and constant propagation can be performed on each phase. In this way, the oscillating 0/1 constant value of clocks, enable, and/or data signals can be used with sequential elements. For clocked latches, for example, constant latch output values, when the clock/enable input signal is low, can be inferred from constant inputs when the clock/enable signal is high.

When multiple input signals, i.e. clock/enable and data input signals, are involved with different periods, enough phases must be created to correctly represent all clock periods. The least common denominator number of phases, determined based on the periods of the multiple input signals, is one solution to ensure enough phases are utilized. The input signals having smaller periods, i.e. having a smaller number of phases than the least common denominator number of phases, may repeat their earlier phases, for example.

Thus, with the illustrative embodiments, a temporal dimension is added to traditional constant propagation performed in static analysis through the use of phases based on input signal oscillations. This temporal dimension permits constant propagation to flow through sequential elements during static analysis of circuit models rather than the static analysis being stopped at such elements. The finer granularity introduced by the implementation of multiple phases for constant value propagation makes it possible to assign and infer constant values which would normally require rigorous simulation to achieve.

To illustrate the manner by which multiphase static analysis may be used to propagate constant values through sequential elements, the following FIGS. 3A-3D provide examples of multiphase analysis of a latch sequential element under various clock and data input signal conditions. FIGS. 3A-3D are only exemplary of the types of relationships between clock and data input signals of input gates and sequential elements and are not to be considered exhaustive of all the possible relationships that may be handled by the mechanisms of the illustrative embodiments.

It should be noted that the examples shown in FIGS. 3A-3D are examples having zero phase delay through the sequential elements, in order to simplify the description herein for purposes of understanding. It should be appreciated that the mechanisms of the illustrative embodiments are equally applicable to sequential elements, such as latches, that have phase delays associated with them. Such phase delays may be modeled such that, due to the delay, a particular phase's constant value may in fact affect a later phase rather than the current phase with which the constant value is associated. Under such conditions, the multiphase static analysis of the illustrative embodiments may introduce additional phases of static analysis to account for any phase delays. Thus, for example, if a particular multiphase static analysis uses four phases, and the sequential elements have a one phase delay, five phases may be utilized in the multiphase static analysis to accommodate the phase delay.

FIG. 3A is an exemplary diagram of multi-phase static analysis constant propagation with regard to a sequential circuit element when the clock of the logic gate has a same period as a data input to the sequential circuit element. For purpose of illustration, FIG. 3A represents a simple net in which an AND gate 310 receives an input signal, GATE, and a first clock input, CLK1. The AND gate 310 generates an enable output that is provided as an ENABLE input signal to a sequential element, which in the depicted example is latch 320. The latch 320 further receives an input signal (INPUT) which, in the depicted example, has a same period as the first clock input CLK1 and the ENABLE input signal. The input signal (INPUT) may be any oscillating, or partially oscillating, input signal including a data signal or a clock signal.

The latch 320 may be, for example, a data latch or D latch, in which, when the enable input is a logic 1, the value of the input signal (INPUT) is latched-in or held in the latch 320, and the output reflects the logic level of the input signal (INPUT). When the enable input falls to a logic 0, the last state of the input signal (INPUT) is held in the latch 320 and is output by the latch 320.

As shown in FIG. 3A, the input and output signals of the elements 310 and 320 have multiple phases denoted by constant values separated by a "/" symbol. In the depicted examples, CLK1 is running at the same speed as the input signal (INPUT), i.e. both signals have the same period. It should be noted, however, that the input signal (INPUT) may have a different period from that of the input clock CLK1, as will be discussed hereafter with regard to FIGS. 3B-3D. In FIG. 3A, however, the clock CLK1, enable signal (ENABLE), and input signal (INPUT) have the same period with each signal having a first phase high and a second phase low. Each of these phases may comprise one or more clock cycles. Thus, only 2 phases need to be used in the multiphase static analysis to propagate constants through the circuit elements.

The constant values of each phase are used to perform a separate static analysis of the net for each phase and thereby generate a plurality of constant value outputs for the various elements 310 and 320 for each of the phases. Each separate iteration of the static analysis is performed separately for each phase, but is linked to other iterations with regard to the behavior of the sequential element, e.g., latch 320, being dependent upon previous phases. That is, the constant values of a previous phase may be used to determine the output of a sequential element in the net during a current phase of the static analysis, depending upon whether the sequential element is clocked or not. It should be noted that, in some illustrative embodiments, some of the phases may be handled simultaneously, as discussed hereafter.

The elements 310 and 320 may be represented in a netlist data structure, hardware description language (HDL) data structure, or any other logic description formatted data structure, in a manner generally known in the art. One or more of the inputs GATE, CLK1, and/or INPUT may be provided as part of the phase-constant data structure, in accordance with the illustrative embodiments, that is input as part of the circuit model. Moreover, one or more of the inputs GATE, CLK1 and/or INPUT may be generated as part of the static analysis performed by a static analyzer in accordance with the illustrative embodiments.

The output of AND gate 310, i.e. ENABLE, is generated by the static analyzer when propagating the multiphase constant values through the AND gate 310 in accordance with the illustrative embodiments. With such propagation, rules may be established for propagation that take into account the nature of the particular logic gates in the circuit design and the constant values for the phases of the inputs to these logic gates. For example, with an AND gate, if the clock/enable input or GATE input to the AND gate is low (logic "0"), then the output of the AND gate will be low. Thus, if the GATE input has a constant "0" value for a number of phases, the output of the AND gate will not be dependent upon the clock signal and thus, can be assumed to be "0" for these phases. Hence these phases, with regard to the AND gate, may be treated as one phase.

On the other hand, as shown in FIG. 3A, if the GATE input signal is a constant 1 (logical "high"), i.e. a 1 value during each phase ("1/1"), the ENABLE input signal to the latch 320 is the same as the clock input CLK1 to the AND gate 310. If the ENABLE input signal to the latch 320 has constant values 0/1 and the input signal (INPUT) to the latch 320 has constant values 0/1, then the output OUT of the latch 320 will have a constant 1 value. This is because the constant value of the output OUT in the first phase, i.e. the non-clocked phase of the latch 320, may be inferred from its constant value in the second phase, i.e. the clocked phase of the latch 320. In other words, in the second phase the latch 320 latches-in, i.e. stores, the "1" constant INPUT value to the latch 320 due to both the ENABLE signal and the INPUT signal being high (logical "1"). Since the clock CLK1, ENABLE, and the INPUT signal are considered to be repeating, the latch 320, in the subsequent phase, which is equal to the first phase, retains the latched-in value from the previous phase, i.e. the "1" constant value. Therefore, the output OUT of the latch 320 during the first phase is the logical "1" constant value latched-in and held during the previous phase.

Thus, in performing static analysis of the net shown in FIG. 3A, based on the phase-constant values specified in the phase-constant data structure and/or generated by the static analysis, the static analyzer recognizes the cyclical repeating nature of the clock, enable, and/or data input signals by inferring constant values based on a repeating set of phase constant values and the nature of the sequential element, e.g., the retaining of a previous value from a previous phase until it is overwritten by the latching-in of a different value during a subsequent phase.

Figure 3B:
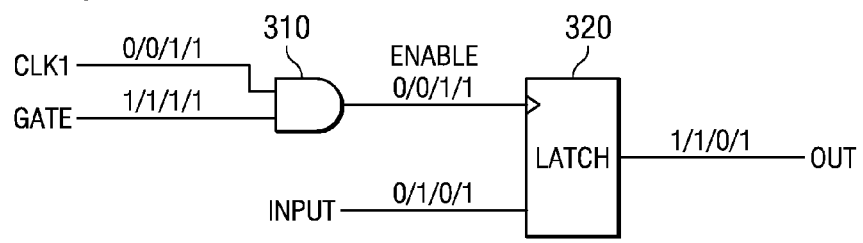

It is not always the case that CLK1 will have the same period as the INPUT signal to the latch 320. FIG. 3B is an exemplary diagram of multi-phase static analysis constant propagation with regard to a sequential circuit element when the period of the clock CLK1 of the logic gate generating an input to the sequential circuit element is half the period of the INPUT signal to the sequential circuit element. Since the INPUT signal is oscillating at twice the speed as the input clock CLK1, it is necessary to have four phases to ensure that all of the phases of each of the clock CLK1, the ENABLE signal, and the INPUT signal are adequately represented by the multiphase static analysis. The four phases are the least common denominator between the phases of the input clock CLK1 and the INPUT signal to the latch 320.

As shown in FIG. 3B, the input clock CLK1 to AND gate 310 has a clock that has two low phases followed by two high phases. The GATE input is a constant high (logical "1") value. Thus, the ENABLE signal output by the AND gate 310 has two low phases followed by two high phases. The INPUT signal has first and third phases being low while the second and fourth phases are high.

With these inputs to the latch 320, the first and second phases of the output OUT are determined by the constant value of the fourth phase. In other words, during the first and second phase, since the ENBALE signal is low (logical "0") the latch 320 retains the value of the previous phase, i.e. phase 4 since the phases are repeating. Thus, the value for output OUT during the first phase is a logical "1". In the third phase, the latch 320 is clocked, i.e. ENABLE is high, and thus, the INPUT signal value for the third phase, i.e. a logical "0," is latched into latch 320 and is output by the latch 320. In the fourth phase, the latch 320 is again clocked and thus, the current INPUT signal value for the fourth phase, i.e. a logical "1," is latched into the latch 320 and is provided as the output OUT.

Thus, again, the repeating phase pattern for a lowest common denominator number of phases is utilized for determining the temporal operation of the sequential element during the multiphase static analysis. The behavior of the latch 320 in this regard is modeled by the static analysis engine based on information obtained from the netlist, the phase-constant data structure, and the results of static analysis of other elements and nets in the circuit model.

Figure 3C:
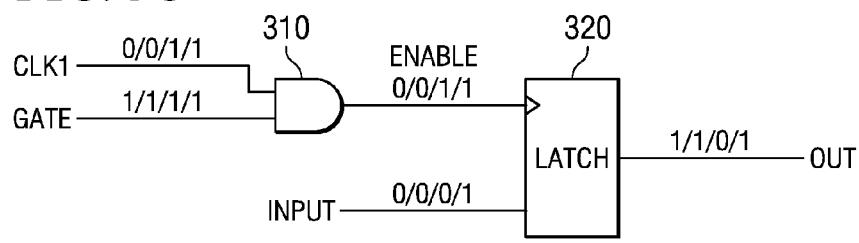

FIG. 3C is an exemplary diagram of multi-phase static analysis constant propagation with regard to a sequential circuit element when the clock of the logic gate, generating a second clock input to the sequential circuit element, has two low phases followed by two high phases while the INPUT signal of the sequential circuit element has three low phases followed by one high phase. In this example, four phases of static analysis are utilized to represent the repeating pattern of phases of clock CLK1, ENABLE, and the INPUT signal.

Again, the first and second phase constant values of the output OUT of the latch 320 are determined from the fourth phase constant value of the latch 320. In the first phase, the latch 320 is not clocked and thus, the INPUT signal value, i.e. logical "1," of the previously clocked phase is retained in the latch 320. In the second phase, the latch 320 is again not clocked and thus, the INPUT signal value, i.e. logical "1," that is already latched-into the latch 320 continues to be held in the latch 320 and output as the output signal OUT. In the third phase, the latch 320 is clocked and thus, the current INPUT signal value for the third phase, i.e. a logical "0," is latched-into the latch 320 and provided as the output OUT. Thereafter, in the fourth phase, the latch 320 is again clocked and the INPUT signal value for the fourth phase, i.e. a logical "1," is latched-into the latch 320 and output as the output signal value OUT.

Figure 3D:
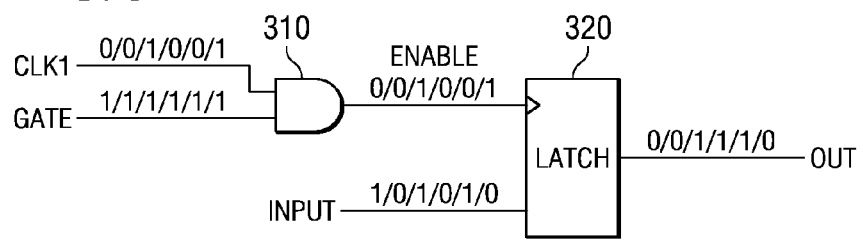

FIG. 3D is an exemplary diagram of multi-phase static analysis constant propagation with regard to a sequential circuit element when the clock of the logic gate, generating an input to the sequential circuit element, has two low phases followed by one high phase while the INPUT signal of the sequential circuit element has one high phase followed by one low phase. As a result, the least common denominator for periods of three and two is six phases. That is, six phases are required to cover all combinations of clock, enable, and input signals that may be experienced by the sequential circuit element, i.e. latch 320. Again, it is assumed that the GATE input is a constant high value, i.e. constant "1."

As shown in FIG. 3D, during a first phase, the latch 320 is not clocked thereby retaining the previously latched-in value from the previous phase, i.e. phase 6, which in this case is a "0" logical value. The second phase of the latch 320 is also not clocked and thus, the "0" value is retained in the latch 320. The third phase is clocked and thus, the corresponding data value "1" is latched into the latch 320 and output. In the fourth phase, the latch 320 is not clocked and thus, the previous "1" data value is maintained in the latch 320. In the fifth phase, the latch 320 is again not clocked and thus, the previous "1" INPUT signal value is again maintained in the latch 320 and output. In the sixth phase, the latch 320 is clocked and thus, the INPUT signal value, i.e. a logical "1," is latched-into the latch 320 and is output.

Thus, again, the multiphase static analysis is performed in a sequence of phases where the last phase of the sequence influences the operation of the sequential element in the first phase of a next iteration of the sequence of phases, e.g., phase 6 influences the operation of latch 320 in phase 1 during a subsequent iteration of the six phases. Moreover, the operation of a sequential element for individual phases within a sequence of phases may be dependent upon the results of operation of the sequential element in a previous phase in the sequence of phases. This type of phase dependency of sequential elements may be modeled in the static analysis engine, or static analyzer, of the illustrative embodiments based on the netlist data structure and phase-constant data structure input as the circuit model.

It should be noted that while the illustrative embodiments are described in terms of constant propagation being performed iteratively for each phase, the illustrative embodiments are not limited to such. Rather, the constant propagation may be performed on multiple phases simultaneously. For example, after the number of phases required is determined, if the clock nets are known, constant propagation for a particular clock net for all phases in which the clock has a 1 value may be performed. Thereafter, constant propagation for all phases in which the clock has a 0 value may be performed simultaneously. Constant propagation of "hard constants" for all phases may be performed in one pass prior to layering on any oscillating phase constants.

FIG. 4 is an exemplary block diagram of a multiphase static analysis mechanism in accordance with one illustrative embodiment. The elements shown in FIG. 4 may be implemented in hardware, software, or any combination of hardware and software. In a preferred embodiment, the elements of FIG. 4 are implemented as software instructions executed by one or more processors.

In one illustrative embodiment, the multiphase static analysis mechanism of FIG. 4 may be provided as software instructions executed on one of a server or client computing device, such as server 104 or client 110 in FIG. 1. In a preferred embodiment, the multiphase static analysis mechanism is implemented in a server computing device with which a client computing device communicates in order to perform multiphase static analysis of a circuit model.

As shown in FIG. 4, the multiphase static analysis mechanism 400 includes a controller 410, a network interface 420, a number of phases determination engine 430, a netlist parser 440, a phase-constant data structure parser 450, a phase constant propagation engine 460, and an output generation engine 470. The controller 410 is responsible for the overall operation of the multiphase static analysis mechanism 400. The controller 410 controls the overall operation and orchestrates the operation of the other elements 420-470.

The network interface 420 provides a mechanism through which data may be sent and received via one or more networks. For example, the network interface 420 provides a mechanism through which the circuit model comprising the netlist and phase-constant data structures, may be received. The network interface 420 further provides an interface through which user commands may be received from client computing devices, for example, and output of the multiphase static analysis mechanism may be accessed by a user of a client computing device.

The controller 410 receives requests for multiphase static analysis via the network interface 420 along with a circuit model 480 comprising netlist and phase-constant data structures 482 and 484. The netlist data structure 482 may be provided in any known format using any known circuit modeling mechanism. For example, the netlist data structure 482 may be provided as part of a hardware description language (HDL) file representation of the circuit model. The HDL file may further specify the periodicity of the clock and/or data inputs to the nets in the netlist data structure 482 as well as other parameters for defining the elements and operation of the circuit model.

In addition to the netlist data structure 482, a phase-constant data structure 484 is provided to the controller 410. This phase-constant data structure 484 defines the various phases of inputs to one or more circuit elements in one or more of the nets in the netlist data structure 482. For example, the phase-costant data structure 484 may define the phases of a single input, e.g., the GATE and/or DATA input in FIGS. 3A-3D, or a plurality of inputs to various circuit elements of the same or different nets in the netlist data structure 482. Thus, if a particular behavior is to be enforced at a particular element within the nets, the phase-constant data structure 484 may specify the element within the netlist data structure 482 and its corresponding phase-constant values for each of a plurality of phases of operation.

Preferably, the phase-constant data structure 484 specifies the constant values for a single sequence of phases with this sequence of phases being repeated. Thus, if a single constant value is to be used as an input, such as the GATE input being a constant 1, then a single value is provided in the phase-constant data structure. However, if the GATE input were to oscillate between a constant 1 and a constant 0, two phases in the phase-constant data structure 484 may be specified as 0/1, for example.

The phase-constant data structure 484 may further define the clock signals that are inputs to the nets of the netlist data structure 482. As mentioned above, the periodicity of the clocks and/or the data input signals may be specified in the HDL file. This periodicity may be used to generate the phases of the clock and/or data signals for a net. Alternatively, the periodicity and constant values for each phase of the clock and/or data signals may be specified in the phase-constant data structure 484.

The number of phases determination engine 430 may take the phase-constant value information from the phase-constant data structure 484 and any clock/data signal periodicity information provided by the HDL file of the circuit model and determine a number of phases that is required to accurately model the behavior of the nets in the netlist data structure 482. In some illustrative embodiments, the number of phases determination engine 430 may invoke the netlist parser 440, described hereafter, to identify sequential elements in the netlist and their associated input signals for determination of the periods of the input signals of the input signals to the sequential elements. In one illustrative embodiment, the number of phases is a least common denominator of the number of phases of each of the clock/data input signals, as determined based on the periods of the clock/data input signals, that are to be modeled in the multiphase static analysis of the nets. Thus, if a clock has a periodicity of 3 and a data input signal has a periodicity of 2, then the least common denominator would be 6 phases.

The netlist parser 440 and phase-constant data structure parser 450 are used to parse the two data structures 482 and 484 to pair up the elements in the nets of the netlist data structure 482 with their corresponding phase-constants specified in the phase-constant data structure 484. The correlation between phase-constants and the elements in the nets is performed for each phase in the number of phases determined by the number of phases determination engine 430.

This information may then be provided to phase constant propagation engine 460 which performs phase constant propagation for each phase specified by the number of phases determination engine 430. That is, for each phase, a particular constant value for the data inputs and clocks of the elements of a net are assumed, as specified by the phase-constant data structure 484 or otherwise determined from static analysis of other portions of the net or nets, and the particular constant values are propagated through the nets. This is repeated for each phase of a sequence of phases comprising the number of phases determined by the number of phases determination engine 430.

The phase constant propagation engine 460 propagates these constants while considering the dependency of the phases in sequential elements of the nets as specified by the netlist data structure 482. Thus, if a net in the netlist data structure 482 contains a latch, for example, then the phase constant propagation engine 460 identifies this element as being a sequential element and determines the current data value of a current phase based on the data value of a previous phase in the sequence of phases. Based on whether or not the sequential element is clocked or not, for example, the data value associated with that sequential element may be kept the same or modified from a previous phase's data value. Since the sequence of phases is considered to be a repeating sequence, a last phase in the sequence of phases may influence the data value associated with the sequential element in a first phase of the sequence of phases. The logic for handling such dependencies is provided in the phase constant propagation engine 460.

Based on the multiphase propagation of constants through the nets of the netlist data structure 482 using the phase-constant values specified in the phase-constant data structure 484, the phase constant propagation engine 460 generates a series of data values for the elements of the nets in the netlist data structure 482. These series of data values for the elements of the nets are provided to the output generation engine 470 which generates an output representative of the operation of the nets during multiple phases of static analysis. The output 490 may be generated by the output generation engine 470 and provided to, or otherwise made accessible by, a client computing device via the network interface 420. The output 490 may then be provided to a verification program or device, or may be inspected by a human designer, to determine if the circuit design represented by the circuit model is operating as intended.

Thus, the illustrative embodiments provide a mechanism that allows the temporal behavior of a sequential circuit element to be considered while doing static analysis. This temporal behavior may be modeled by performing the static analysis in a number of phases. As a result, a simplified mechanism, when compared to full simulation of a circuit design, for verifying the operation of a circuit design is made possible.

FIG. 5 is a flowchart outlining an exemplary operation for performing multiphase static analysis in accordance with one illustrative embodiment. The operation outlined in FIG. 5 assumes that static analysis constant propagation is applied to each phase separately in an iterative manner. However, as mentioned above, it should be appreciated that for some nets, it may be possible to simultaneously perform constant propagation for all phases in which a constant value is present, such as with "hard constant" propagation of clock nets.

It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

The operation outlined in FIG. 5 may be performed by a multiphase static analysis mechanism, such as that shown in FIG. 4, for example. As shown in FIG. 5, the operation starts when the multiphase static analysis mechanism receives a request to perform multiphase static analysis of a circuit model (step 510). The multiphase static analysis mechanism receives the circuit model comprising the netlist data structure, or other logic description formatted data structure, and phase-constant data structure (step 520). The multiphase static analysis mechanism determines an appropriate number of phases for the multiphase static analysis operation, e.g., a least common denominator of the periodicities of the clock and/or data inputs (step 530). The multiphase static analysis mechanism parses the netlist and phase-constant data structures to correlate circuit elements in the nets with phase-constant sequences specified in the phase constant data structure for the number of phases determined in step 530 (step 540).

For a next phase in a sequence of phases corresponding to the number of phases determined in step 530, the multiphase static analysis mechanism propagates a corresponding constant value for the inputs to the various elements of the nets in the netlist data structure through the nets (step 550). The multiphase static analysis mechanism records the resulting data values for the elements of the nets in an output data structure (step 560). As mentioned above, for sequential circuit elements in the nets, the propagation of constant values may entail considering the data value associated with the sequential circuit element from a previous phase.

The multiphase static analysis mechanism determines if additional phases need to be processed (step 570). If so, the operation returns to step 550. Otherwise, if all phases of the multiphase static analysis have been performed, the multiphase static analysis mechanism makes the resulting output data structure available for verification of the circuit design (step 580). This may involve outputting the output data structure to a client computing device, inputting the output data structure to a verification program, or the like. The operation then terminates.

Thus, the mechanisms of the illustrative embodiments provide for multiphase static analysis of circuit models. The multiphase static analysis allows constants to be propagated through sequential elements while considering the data values associated with the sequential elements in previous phases of operation of the sequential elements. Thus, the dependencies between phases of a sequence of phases in the operation of sequential elements is modeled by the multiphase static analysis of the illustrative embodiments. As a result, static analysis need not be stopped at sequential circuit elements but may progress through such sequential circuit elements in a phased manner.

The illustrative embodiments may take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer readable medium may be any apparatus that may contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

As described previously above, a data processing system suitable for storing and/or executing program code will include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for modeling a circuit, comprising:
    providing a constant data structure identifying constant values for a plurality of stages of operation of at least one element in a net of a circuit design, wherein the constant data structure associates individual constant values to oscillating signals of the net for individual stages of a static analysis of the net;
    performing static analysis of the net by propagating the constant values through the net in multiple stages based on the constant data structure; and
    outputting results of the propagation of the constant values through the net for the multiple stages, wherein the results are indicative of valid or invalid operation of the net, wherein:
    the at least one element in the net of the circuit design comprises at least one sequential element,
    a number of stages of the static analysis is determined based on periods of a plurality of oscillating input signals to the net, and wherein the number of stages is a least common denominator number of stages determined based on the periods of the plurality of oscillating input signals,
    the static analysis of the net in a first stage of the multiple stages is performed based on results of the static analysis of the net in a second stage of the multiple stages that is previous to the first stage, and
    the propagation of the constant values through the net for the multiple stages does not model the delay timing of the elements of the net.

* * * * *